(12) United States Patent
Kwack et al.

(10) Patent No.: US 8,669,557 B2
(45) Date of Patent: Mar. 11, 2014

(54) THIN FILM TRANSISTOR SUBSTRATE AND METHOD FOR FABRICATING THE SAME

(75) Inventors: Hee-Young Kwack, Gyeonggi-do (KR); Mun Gi Park, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 280 days.

(21) Appl. No.: 13/221,058

(22) Filed: Aug. 30, 2011

(65) Prior Publication Data
US 2012/0280237 A1 Nov. 8, 2012

(30) Foreign Application Priority Data
May 3, 2011 (KR) .................. 10-2011-0042176

(51) Int. Cl.
*H01L 29/10* (2006.01)
(52) U.S. Cl.
USPC .............. 257/59; 257/E33.053; 257/E21.412; 438/157
(58) Field of Classification Search
None
See application file for complete search history.

(56) References Cited
U.S. PATENT DOCUMENTS
2006/0049402 A1 * 3/2006 Lee et al. ................. 257/59
* cited by examiner

*Primary Examiner* — Yasser A Abdelaziez
(74) *Attorney, Agent, or Firm* — Morgan, Lewis & Bockius LLP

(57) ABSTRACT

The present invention relates to a thin film transistor substrate and a method for fabricating the same which can reduce a number of steps. The method for fabricating a thin film transistor substrate includes the steps of a first mask step forming a first conductive pattern on a substrate to include a gate electrode and a gate line, a second mask step depositing a gate insulating film on the substrate having the first conductive pattern formed thereon and forming a second conductive pattern on the gate insulating film to include a semiconductor pattern, source and drain electrodes and data line, a third mask step depositing a first protective film on the substrate having the second conductive pattern formed thereon and forming a pixel contact hole for exposing the drain electrode passed through the first protective film, a fourth mask step forming a third conductive pattern on the first protective films to have a common electrode and a common line and a second protective film to form an undercut with the common electrode and to include a pixel contact hole which exposes the drain electrode on the common electrode, and a fifth mask step forming a fourth conductive pattern to include a pixel electrode spaced from the common electrode by a space provided by the undercut.

7 Claims, 14 Drawing Sheets

THIN FILM TRANSISTOR SUBSTRATE AND METHOD FOR FABRICATING THE SAME

CROSS REFERENCE TO RELATED APPLICATION

This application claims the benefit of the Korean Patent Application No. 10-2011-0042176, filed on May 3, 2011, which is hereby incorporated by reference in its entirety.

BACKGROUND OF THE DISCLOSURE

1. Field of the Disclosure

The present invention relates to a thin film transistor substrate and a method for fabricating the same, and more particularly to a thin film transistor substrate and a method for fabricating the same which can reduce a number of fabrication steps.

2. Discussion of the Related Art

A liquid crystal display device controls light transmissivity of liquid crystals having dielectric anisotropy by using an electric field to display a picture. The liquid crystal display device is provided with a liquid crystal panel having a thin film transistor substrate and a color filter substrate bonded together to face each other, a backlight unit for directing a light to the liquid crystal panel, and a driving circuit for driving the liquid crystal panel.

The thin film transistor substrate has gate lines and data lines formed to cross each other with a gate insulating film disposed therebetween on a lower substrate, a thin film transistor (TFT) formed at every crossed portion thereof, a pixel electrode in contact with a drain electrode of the thin film transistor through a contact hole, and a lower alignment film coated thereon.

The color filter substrate has a color filter for producing a color, a black matrix for preventing a light from leaking, a common electrode for forming a vertical electric field to the pixel electrode, and an upper alignment film coated thereon for alignment of the liquid crystals.

Thus, the liquid crystal panel can be fabricated in a TN (Twisted-Nematic) mode in which an electrode is provided to each of the substrates, the liquid crystals are arranged such that a director thereof is twisted at 90° and a voltage is applied to the electrodes to drive the director, and operated by using an IPS (In-Plane Switching) mode in which the director of the liquid crystals are controlled with a horizontal electric field formed by two electrodes on one substrate, or an FFS (Fringe Field Switching) mode in which liquid crystal molecules are made to move by a fringe field formed between two electrodes of a transparent conductive material with a small gap therebetween.

The thin film transistor substrate of a liquid crystal panel using the FFS mode is fabricated by a method including steps of forming a gate electrode by using a first mask, forming a semiconductor pattern by using a second mask, forming source/drain electrodes by using a third mask, forming first protective film having pixel contact holes and pad region contact holes by using a fourth mask, forming a pixel electrode by using a fifth mask, forming second protective film and pixel contact holes and pad region contact holes in the second protective film by using a sixth mask, and forming a common electrode on the second protective film by using a seventh mask. As such, the method for fabricating the FFS mode thin film transistor substrate requires at least seven masking steps, and thus a process cost and time is great.

SUMMARY OF THE DISCLOSURE

The present invention is directed to a thin film transistor substrate and a method for fabricating the same.

One object of the present invention is to provide a thin film transistor substrate and a method for fabricating the same which can reduce a number of fabrication steps.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose according to one aspect of the invention, as embodied and broadly described herein, a thin film transistor substrate may include a gate line; a data line crossing the gate line; a thin film transistor including a gate electrode connected to the gate lines, a source electrode connected to the data lines, a drain electrode formed to face the source electrode and a semiconductor pattern formed to overlap with the gate electrode with the gate insulating film disposed therebetween; first and second protective films covering the thin film transistor where each of the protective films has pixel contact holes which expose the drain electrode of the thin film transistor; a pixel electrode formed on the second protective film to be connected to the drain electrode; and a common electrode formed to form a fringe field with the pixel electrode and to be spaced from the pixel electrode by a space provided by an undercut with respect to the second protective film.

The thin film transistor substrate according to some embodiments may further include a gate pad connected to the gate line and a data pad connected to the data line.

The gate pad according to some embodiments may include a gate pad lower electrode connected to the gate line; a gate contact hole passed through the first and second protective films and the gate insulating film; and a gate pad upper electrode connected to the gate lower electrode, and formed of the same material on the same layer as the pixel electrode and spaced from the common electrode by the space provided by the undercut.

The data pad according to some embodiments may include a data pad lower electrode connected to the data line; a data contact hole passed through the first and second protective films; and a data pad upper electrode connected to the data lower electrode, and formed of the same material on the same layer as the pixel electrode and spaced from the common electrode by the space provided by the undercut.

The pixel electrode according to some embodiments may have a thickness thicker than a thickness of the common electrode.

The second protective film according to some embodiments may have a width smaller than a width of the first protective film. The first protective film may include two or more protective films.

In another aspect of the present invention, a method for fabricating a thin film transistor substrate may include the steps of a first mask step forming a first conductive pattern on a substrate to include a gate electrode and a gate line, a second mask step depositing a gate insulating film on the substrate having the first conductive pattern formed thereon and forming a second conductive pattern on the gate insulating film to include a semiconductor pattern, source and drain electrodes and a data line, a third mask step depositing first protective film on the substrate having the second conductive pattern formed thereon and forming a pixel contact hole for exposing the drain electrode passed through the first protective film, a fourth mask step forming a third conductive pattern on the first protective film to have a common electrode and a common line, and a second protective film to form an undercut with the common electrode and to include a pixel contact hole which exposes the drain electrode on the common electrode, and a fifth mask step forming a fourth conductive pattern to include a pixel electrode spaced from the common electrode by a space provided by the undercut.

The gate electrode and the gate line according to some embodiments may comprise at least two layers of electrode materials.

The method according to further embodiments may further include a step of forming a gate pad connected to the gate line, wherein the gate pad includes a gate pad lower electrode formed of the same material at the same time as the gate electrode by the first mask step, a gate contact hole formed to pass through the gate insulating film and the first and second protective films by the third mask step and the fourth mask step, and a gate pad upper electrode made of the same material as the pixel electrode, and formed at the same time, as the pixel electrode by the fifth mask step.

The method according to additional embodiments may further include a step of forming a data pad connected to the data line, wherein the data pad includes a data pad lower electrode connected to the data line, a data contact hole passed through the first and second protective films, and a data pad upper electrode formed of the same material at the same time as the pixel electrode connected to the data lower electrode and spaced from the common electrode by a space provided by the undercut.

The fourth mask step according to yet additional embodiments may include the steps of depositing a transparent layer, an inorganic insulating material and photoresist on the substrate having the first protective film formed thereon in succession, forming a photoresist pattern at a region except a region having the pixel contact holes formed therein with a width smaller than a width of the first protective film, and patterning the second protective film to have a same width as the width of the photoresist pattern by etching with the photoresist pattern, wet etching the transparent layer with the second protective film, and forming the transparent layer to have an undercut by the wet etching.

The pixel electrode according to some embodiments may have a thickness thicker than a thickness of the common electrode.

It is to be understood that both the foregoing general description and the following detailed description of the present invention are only exemplary and are intended to provide further explanation of the invention as claimed.

BRIEF DESCRIPTION OF THE DRAWINGS

The accompanying drawings are included to provide a further understanding of the disclosure and are incorporated in and constitute a part of this application The drawings illustrate embodiment(s) of the disclosure and together with the description serve to explain the principle of the disclosure. In the drawings.

DESCRIPTION OF SPECIFIC EMBODIMENTS

Reference will now be made in detail to the specific embodiments of the present invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the present invention.

Exemplary embodiments of the present invention will be described with reference to FIGS. 1 to 10.

Figure 1:
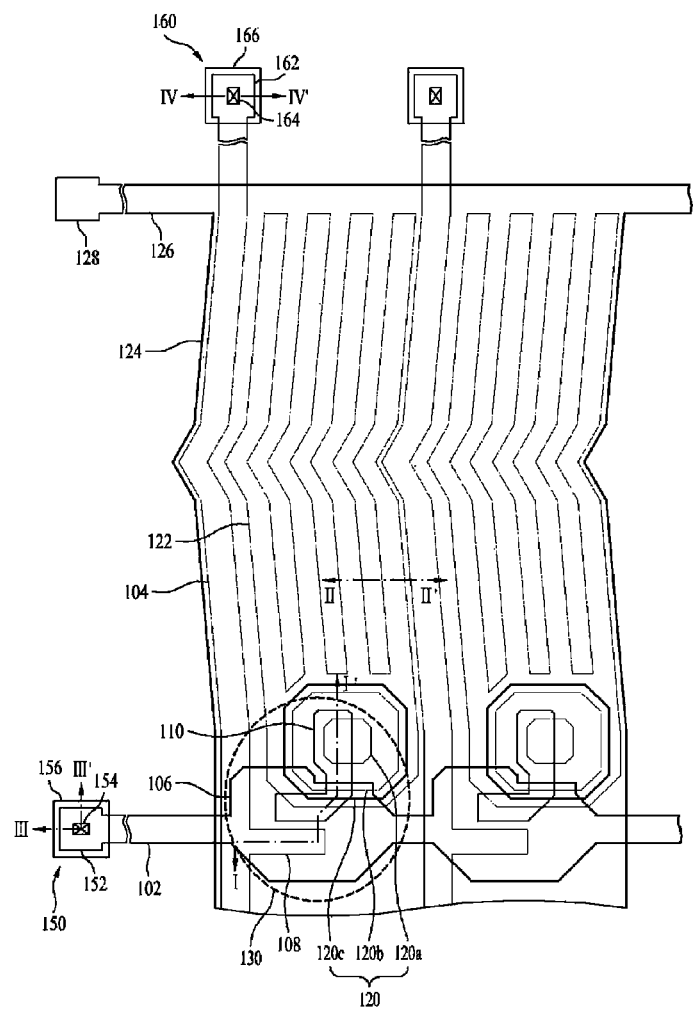
FIG. 1 illustrates a plan view of a thin film transistor substrate in accordance with exemplary embodiments of the present invention.
Figure 2:
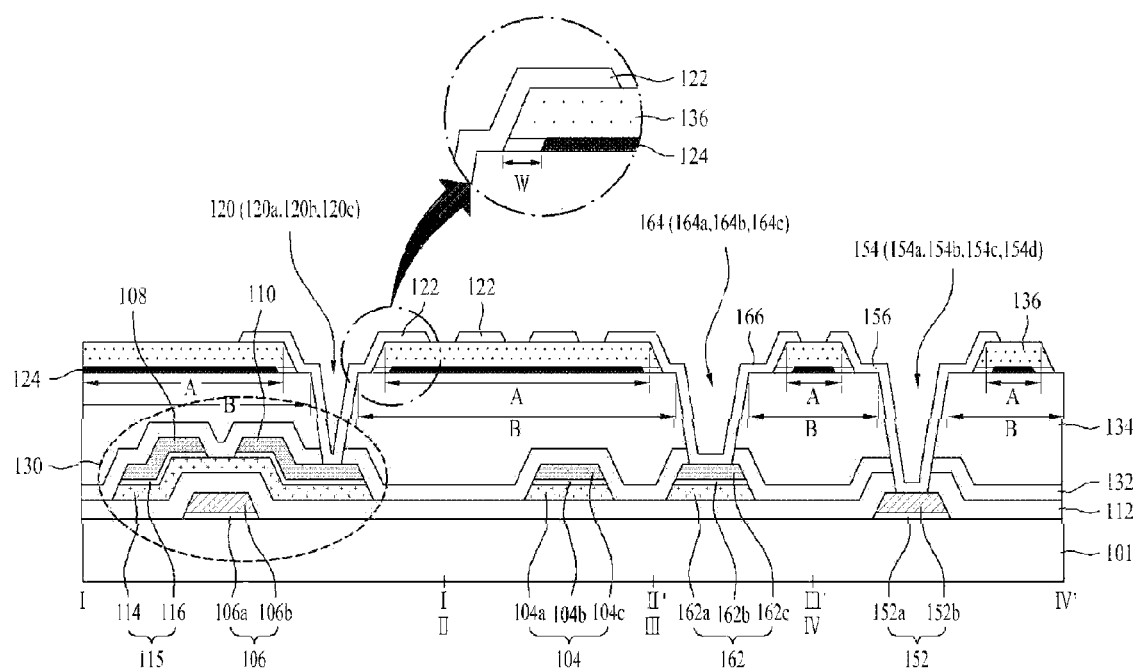
FIG. 2 illustrates section across lines I-I', II-II', III-III', and IV-IV' in the thin film transistor substrate shown in FIG. 1.

FIG. 1 illustrates a plan view of a thin film transistor substrate in accordance with an exemplary embodiment of the present invention, and FIG. 2 illustrates section across lines I-I', II-II', III-III', and IV-IV' in the thin film transistor substrate shown in FIG. 1.

Referring to FIGS. 1 and 2, the thin film transistor substrate according to some embodiments may include a thin film transistor connected to a gate line 102 and a data line 104, a pixel electrode 122 formed on a pixel region provided at a crossed structure of the gate line 102 and the data line 104, a common electrode 124 which forms a fringe field with the pixel electrode 122, a gate pad 150 connected to the gate line 102, a data pad 160 connected to the data line 104, and a common pad 128 connected to a common line 126.

According to FIG. 1, the thin film transistor has a pixel signal supplied to the data line 104 to be charged and sustained at the pixel electrode 122 in response to a scan signal supplied to the gate line 102. For this, the thin film transistor 130 may have a gate electrode 106, a source electrode 108, a drain electrode 110, an active layer 114 and an ohmic contact layer 116.

Also according to FIGS. 1 and 2, the gate electrode 106 formed on a substrate 101 is connected to the gate line 102 to have the scan signal supplied thereto from the gate line 102. The source electrode 108 is connected to the data line 104 to have the pixel signal supplied thereto from the data line 104. The drain electrode is formed opposite to the source electrode 108 with a channel portion of the active layer 114 disposed therebetween for supplying the pixel signal from the data line 104 to the pixel electrode 122. The active layer 114 is formed at the channel portion between the source and drain electrodes 108 and 110 overlapped with the gate electrode 106 with a gate insulating film 112 disposed therebetween. The ohmic contact layer 116 is formed between the source electrode 108 and the active layer 114, and between the drain electrode 110 and the active layer 114 (i.e., over the active layer 114 except the channel portion). The ohmic contact layer 116 serves to reduce an electric contact resistance between the source electrode 108 and the active layer 114, and/or between the drain electrode 110 and the active layer 114.

According to FIG. 2, the pixel electrode 122 is connected to the drain electrode 110 of the thin film transistor through first to third pixel contact holes 120a, 120b and 120c. According to this, the pixel electrode 122 has the pixel signal supplied thereto from the data line 104 through the thin film transistor.

According to the exemplary embodiment shown in FIGS. 1 and 2, the common electrode 124 is connected to the common line 126 to have a common voltage supplied thereto through the common line 126. The common electrode 124 overlaps with the pixel electrode 122 with a third protective film 136 disposed therebetween to form a fringe field. The fringe field makes the liquid crystal molecules arranged in a lateral direction between the thin film transistor substrate and the color filter substrate to rotate owing to the dielectric anisotropy. And, light transmissivity of the light passing through the pixel region can vary with an extent of rotation of the liquid crystal molecules, to produce a picture. In this exemplary embodiment, the common electrode 124 is formed on the second protective film 134 to have an undercut structure with respect to the third protective film 136, and by the undercut structure of the common electrode 124 and the third protective film 136, the common electrode 124 and the pixel electrode 122 is spaced from each other. Thus, the undercut structure provides a space W between the common electrode 124 and the pixel electrode 122. And, the common electrode 124, formed on the thin film transistor, can serve as a shielding electrode for shielding the data voltage, and the second protective film 134 is formed of an organic insulating material, for an example, photo-acryl, for reducing formation of a parasitic capacitor between the common electrode 124 and the data line 104, enabling to make a distance between the common electrode 124 and the data line 104 greater.

In some embodiments, the pixel electrode 122 has a thickness greater than the common electrode 124. As described before, this is because the undercut structure of the common electrode 124 and the third protective film 136 makes the third protective film 136 to have a width greater than a width of the common electrode 124. According to this, when the pixel electrode 122 is deposited on the third protective film 135 of the undercut structure, the thickness of the pixel electrode 124 is formed thicker than the thickness of the common electrode, to prevent opening of the pixel electrode 122.

In further embodiments, in order to improve step coverage of the pixel electrode 122 formed on the third protective film 136, a width A of the third protective film 136 is formed smaller than the width B of the second protective film 134.

And, the common electrode 124 may be formed of a transparent electrode material, including, but not limited to, tin oxide (TO), indium tin oxide (ITO), indium zinc oxide (IZO), indium tin zinc oxide (ITZO), and a mixture thereof.

The gate pad 150 supplies the scan signal from a gate driver (not shown) to the gate line 102. For this, in some embodiments, the gate pad 150 has a gate pad lower electrode 152 connected to the gate line 102, and a gate pad upper electrode 156 connected to the gate pad lower electrode 152 through a contact hole 154 passed through the optional first protective film 132, the second protective film 134, and the third protective film 136 and the gate insulating film 112. The gate pad upper electrode 156 may be formed of the same material on the same layer as the pixel electrode 122. According to the exemplary embodiment shown in FIG. 2, the gate pad upper electrode 156 is spaced from the common electrode 124 such that the gate pad upper electrode 156 is not in contact with the common electrode 124 formed on the second protective film 134. Using the space of the undercut structure, the common electrode 124 and the gate pad upper electrode 156 can be spaced not to be in contact with each other. The gate pad lower electrode 152 may have at least two layers as shown in FIG. 2.

The data pad 160 supplies the pixel signal from a data driver (not shown) to the data line 104. For this, in some embodiments, the data pad 160 has a data pad lower electrode 162 connected to the data line 104, and a data pad upper electrode 166 connected to a data pad lower electrode 162 through a contact hole 164 passed through the optional first, second, and third protective films 132, 134 and 136. The data pad upper electrode 166 may be formed of the same material on the same layer as the pixel electrode 122. According to the exemplary embodiment shown in FIG. 2, the data pad upper electrode 166 is spaced from the common electrode 124 such that the data pad upper electrode 166 is not in contact with the common electrode 124 formed on the second protective film 134. Using the space of the undercut structure, the common electrode 124 and the data pad upper electrode 166 can be spaced not to be in contact with each other. The data pad lower electrode 162 may have a stacked structure of the drain electrode 162c and the semiconductor layers 162a and 162b as shown in FIG. 2.

FIGS. 3A to 10 illustrate plan views and sections for describing an exemplary step for fabricating the thin film transistor substrate shown in FIG. 2.

Figure 3A:
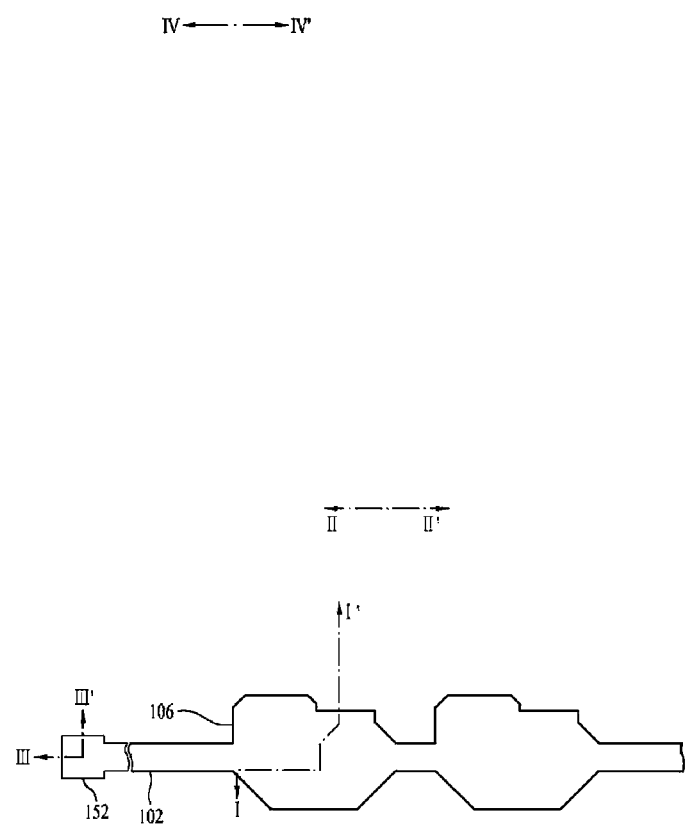
FIGS. 3A and 3B illustrate a plan view and a section showing an exemplary step for fabricating a first conductive pattern of the thin film transistor substrate shown in FIG. 1 or 2, respectively.
Figure 3B:
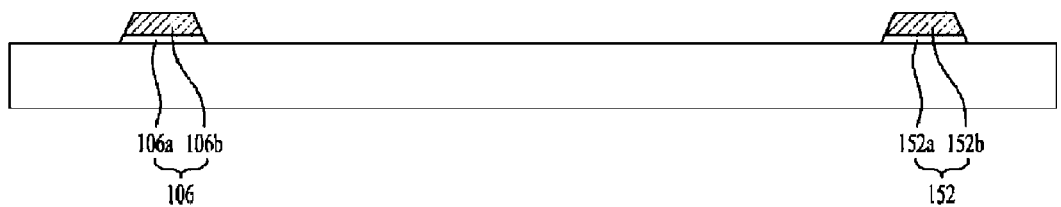

Referring to FIGS. 3A and 3B, a first conductive pattern can be formed on a substrate 101 to include a gate electrode 106, a gate line 102 and a gate pad lower electrode 152.

In detail, at least two layers of gate metal layers, such as 106a/106b and 152a/152b, can be deposited by, for example, sputtering, on a substrate 101. The gate metal layers can be formed of a stack of at least two layers including, but not limited to Al/Cr, Al/Mo, Al(Nd)/Al, Al(Nd)/Cr, Mo/Al(Nd)/Mo, Cu/Mo, Cu/Mo/Ti, Ti/Al(Nd)/Ti, Mo/Al, Mo/Ti/Al(Nd), Cu alloy/Mo, Cu alloy/Al, Cu alloy/Mo alloy, Cu alloy/Al alloy, Al/Mo alloy, Mo alloy/Al, or in the other order, or a single layer of Mo, Ti, Cu, AlNd, Al, Cr, Mo alloy, a Cu alloy, an Al alloy. Then, the gate metal layers can be patterned by photolithography and etching with a first mask, to form the first conductive pattern to include the gate electrode 106, the gate line 102 and the gate pad lower electrode 152.

Figure 4A:
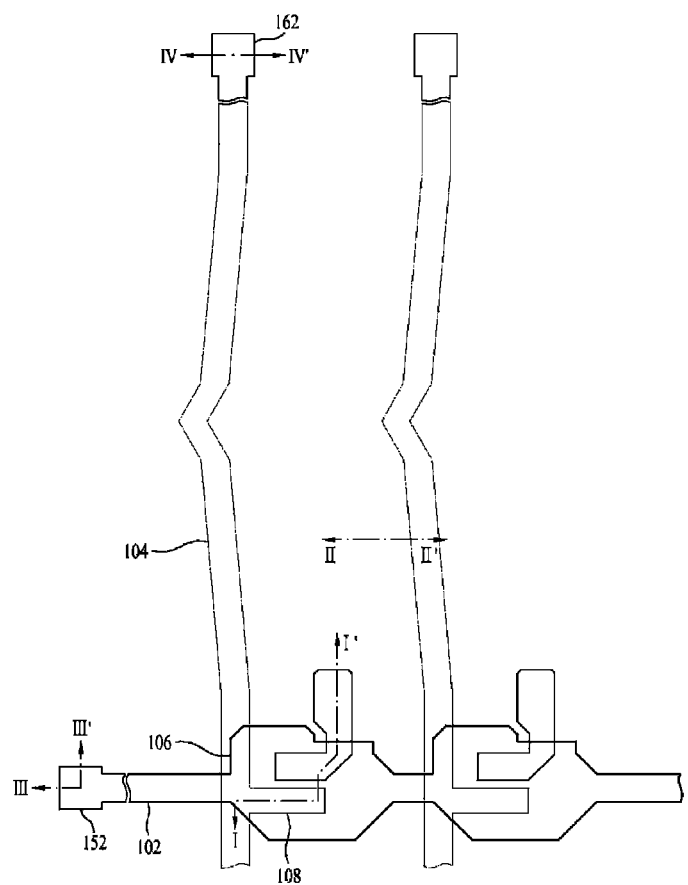
FIGS. 4A and 4B illustrate a plan view and a section showing an exemplary step for fabricating a semiconductor pattern and a second conductive pattern of the thin film transistor substrate shown in FIG. 1 or 2, respectively.
Figure 4B:
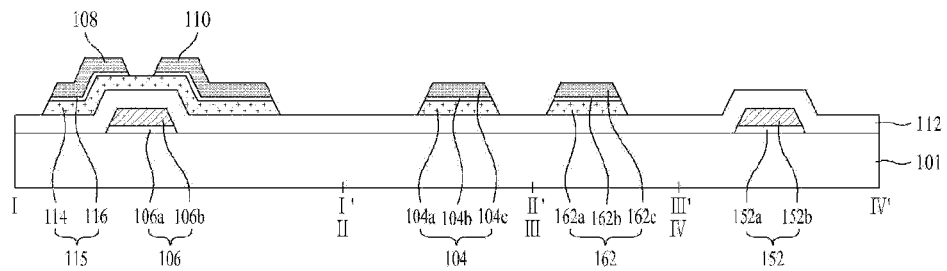

Referring to FIGS. 4A and 4B, a gate insulating film 112 is formed on the substrate 101 having the first conductive pattern formed thereon, and a second conductive pattern is formed on the substrate 101 having the gate insulating film 112 formed thereon to include a semiconductor pattern 115 having an active layer 114 and an ohmic contact layer 116, source and drain electrodes 108 and 110, a data line 104 and a data pad lower electrode 162.

In detail, a gate insulating film 112, an amorphous silicon layer 132, an impurity ($n^+$ or $p^+$) doped amorphous silicon layer 216 and a data metal layer 218 can be formed on the lower substrate 101 having the gate metal pattern formed thereon in succession. For example, the gate insulating film 112, the amorphous silicon layer 132 and the impurity doped amorphous silicon layer 216 can be formed by Plasma-enhanced chemical vapor deposition (PECVD), and the data metal layer 218 can be formed by sputtering. The gate insulating film 112 can be formed of inorganic insulating material including, but not limited to, SiOx and SiNx, and the data metal layer 218 can be formed of single metal layer of a material including, but not limited to, Mo, Ti, Cu, AlNd, Al, Cr, a Mo alloy, a Cu alloy, an Al alloy, or a stack of at least two layers of materials including, but not limited to, Al/Cr, Al/Mo, Al(Nd)/Al, Al(Nd)/Cr, Mo/Al(Nd)/Mo, Cu/Mo, Ti/Al(Nd)/Ti, Mo/Al, Mo/Ti/Al(Nd), Cu alloy/Mo, Cu alloy/Al, Cu alloy/Mo alloy, Cu alloy/Al alloy, Al/Mo alloy, Mo alloy/Al, or single layer of materials including, but not limited to, Mo, Ti, Cu, AlNd, Al, Cr, Mo alloy, a Cu alloy, an Al alloy. Then, after coating photoresist on the data metal layer 218, the photoresist can be subjected to exposure and development by photolithography by using a slit mask or a halftone mask, to form a photoresist pattern 220a and 220b. This will be described with reference to FIGS. 5A and 5B.

Figure 5A:
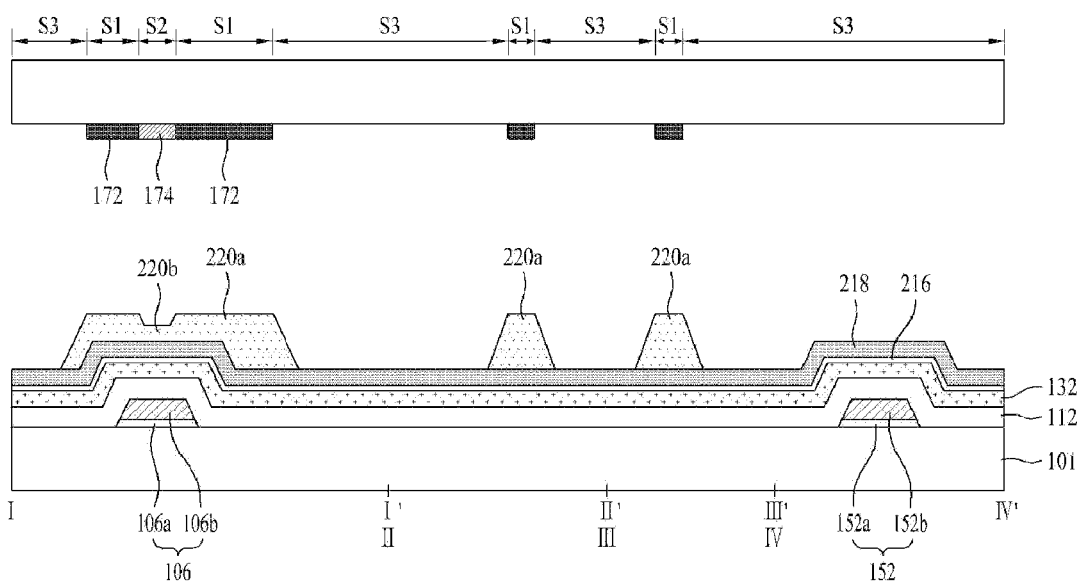
FIGS. 5A and 5B illustrate sections showing an exemplary mask step for fabricating the semiconductor pattern and the second conductive pattern shown in FIG. 4B, respectively.

Referring to FIG. 5A, the halftone mask can have a shielding region 51 having a shielding layer 172 formed on a substrate, a transflective region S2 having a transflective layer 174 formed on a substrate and a transmissive region S3 only of the substrate. Thus, the halftone mask can be used, or, though not shown, a slit mask can be used. A case in which the halftone mask is applied will be described, as an example. The shielding region 51 is positioned at a region the semiconductor pattern and the second conductive pattern are to be formed thereon for shielding a UV beam to leave a first photoresist pattern 220a after development as shown in FIG. 5A. The transflective region S2 has the transflective layer 174 stacked on a region where the channel of the thin film transistor is to be formed thereon for controlling light transmissivity to leave a second photoresist pattern 220b thinner than the first photoresist pattern 220a as shown in FIG. 5A after development. And, the transmissive region S3 transmits the UV beam entirely to remove the photoresist as shown in FIG. 5A after development.

Figure 5B:
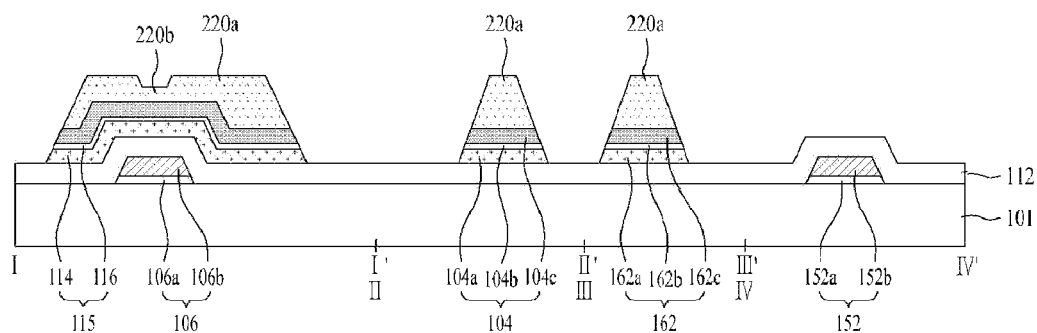

Referring to FIGS. 5A and 5B, the data metal layer 218, the amorphous silicon layer 132 and the impurity (n type or p type) doped amorphous silicon layer 216 are subjected to etching by using the photoresist pattern 220a and 220b having a step to pattern the data metal layer 218, the amorphous silicon layer 132 and the impurity doped amorphous silicon layer 216 to form the second conductive pattern and the underlying semiconductor pattern.

Then, the photoresist pattern 220a can be ashed by using oxygen plasma to make the first photoresist pattern 220a thinner and to remove the second photoresist pattern 220b. Then, the data metal layer 218 exposed by the etching and the underlying impurity doped amorphous silicon layer 116 can be removed by an etching step using the first photoresist pattern 220a. According to this, the source electrode 108 and the drain electrode 110 are separated from each other and the active layer 114 can be exposed as shown in FIG. 4B.

Then, the first photoresist pattern 220a can be removed from upper sides of the source/drain electrodes 108 and 110, the data line 104, and the data lower electrode 162.

Figure 6A:
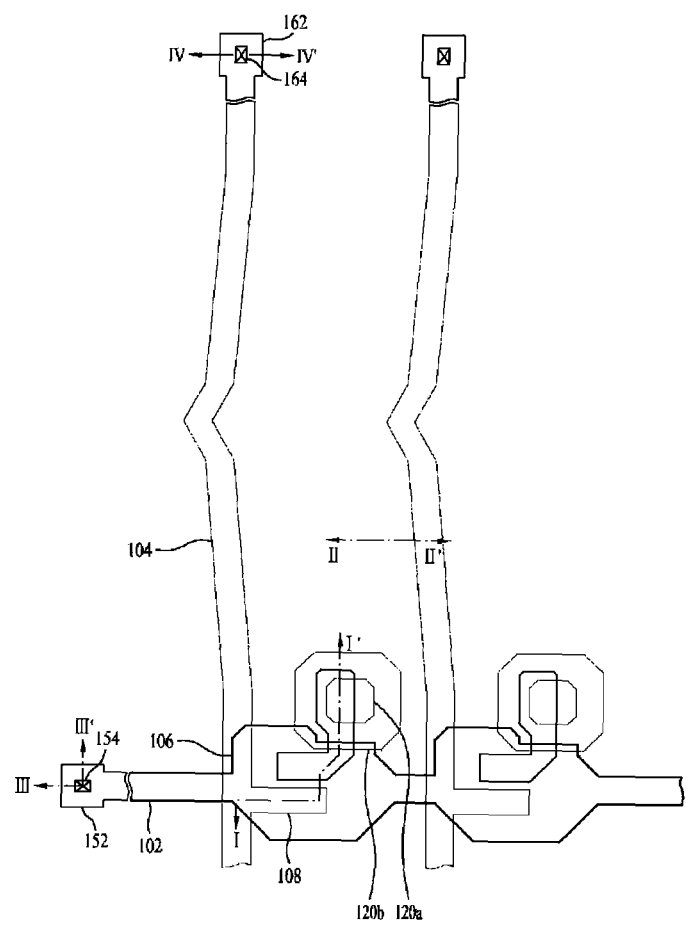
FIGS. 6A and 6B illustrate a plan view and a section showing an exemplary step for fabricating first and second protective films of the thin film transistor substrate shown in FIG. 1 or 2, respectively.
Figure 6B:
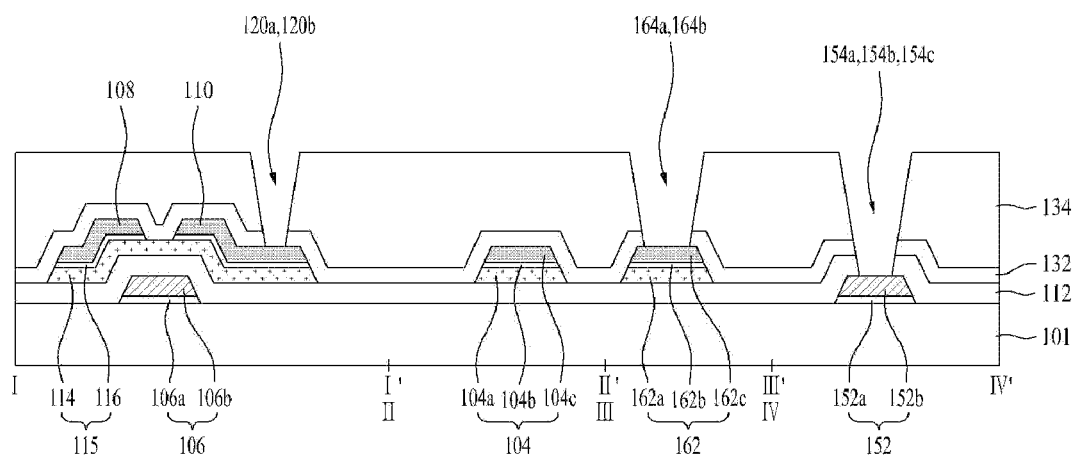

Referring to FIGS. 6A and 6B, a first protective film 132 and a second protective film 134 are formed on the substrate 101 having the semiconductor pattern 115 and the second conductive pattern formed thereon to have gate contact holes 154a, 154b and 154c, data contact holes 164a and 164b and first and second pixel contact holes 120a and 120b. Although not shown in figures, the first protective film may be omitted according to other embodiments of the present invention.

In detail, the optional first protective film 132 and a second protective film 134 can be formed on the gate insulating film 112 having the semiconductor pattern and the second conductive pattern formed thereon by PECVD or chemical vapor deposition (CVD). The first protective film 132 can be formed of an inorganic insulating material the same with the gate insulating film, and the second protective film 134 can be formed of an organic insulating material including, but not limited to, photo-acryl. The first and second protective films 132 and 134 can be patterned by photolithography and etching by using a third mask to form the gate contact holes 154a, 154b and 154c, the data contact holes 164a and 164b and the first and second pixel contact holes 120a and 120b. The first and second pixel contact holes 120a and 120b can expose the drain electrode 110 passed through the first and second protective films 132 and 134; the gate contact holes 154a, 154b and 154c can expose the gate pad lower electrode 152 passed through the gate insulating film 112 and the first and second protective films 132 and 134; and the data contact holes 164a and 164b can expose the data pad lower electrode 162 passed through the first and second protective films 132 and 134.

Figure 7A:
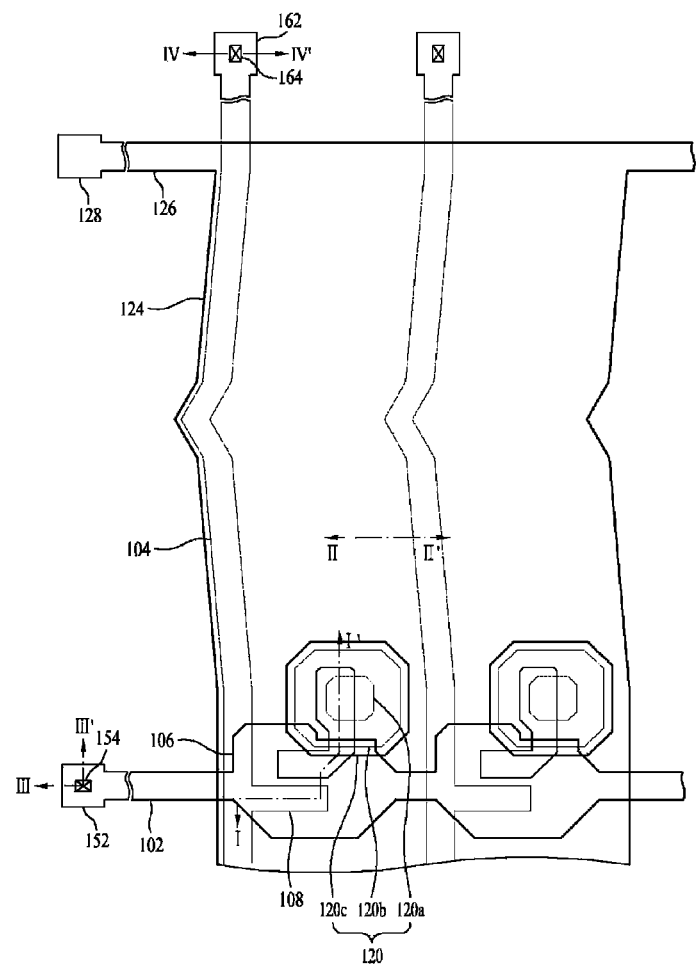
FIGS. 7A and 7B illustrate a plan view and a section showing an exemplary step for fabricating a third conductive pattern and a third protective film of the thin film transistor substrate shown in FIG. 1 or 2, respectively.
Figure 7B:
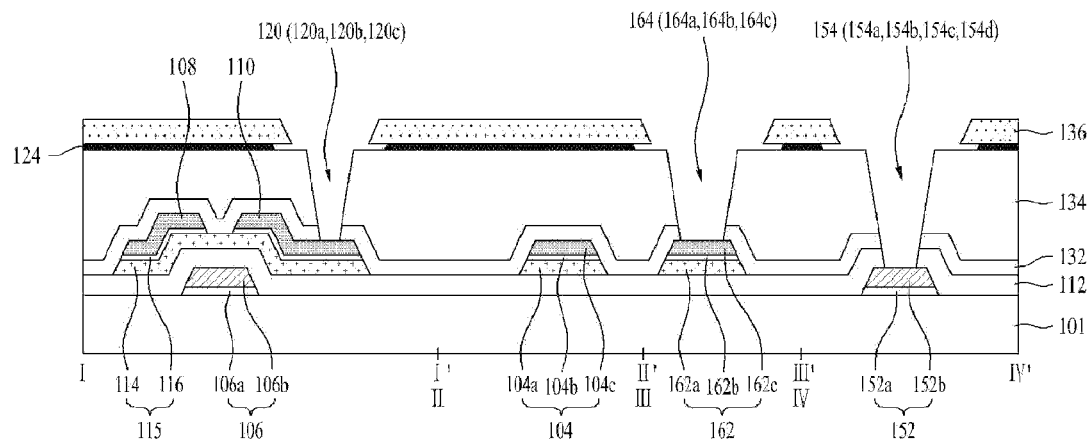

Referring to FIGS. 7A and 7B, a third conductive pattern including a common electrode 124, a common line 126 and a common pad 128, and a third protective film 136 including a third pixel contact hole 120c, a gate contact hole 154d and a data contact hole 164c are formed on the substrate 101 having the optional first protective film 132 and the second protective film 134 formed thereon. This will be described with reference to FIGS. 8A and 8B.

Figure 8A:
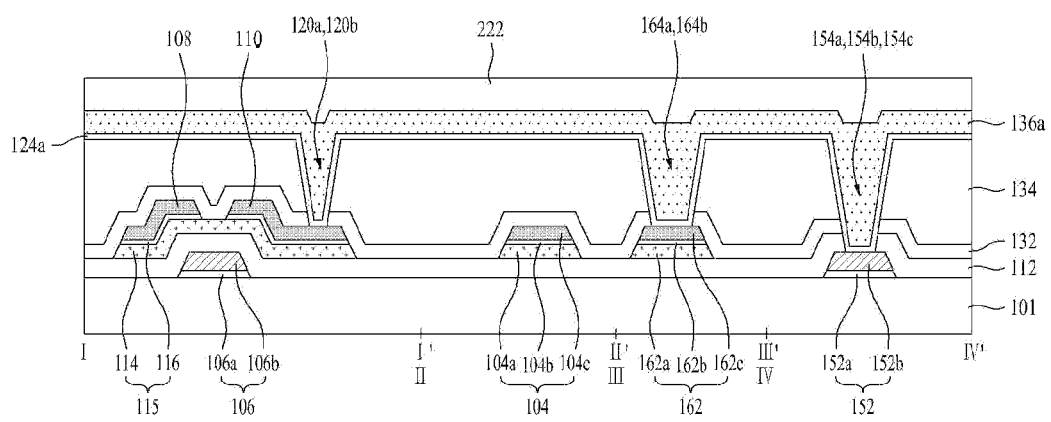
FIGS. 8A-8C illustrate sections showing an exemplary mask step for forming the third conductive pattern and the third protective film in FIG. 7B, respectively.
Figure 8B:
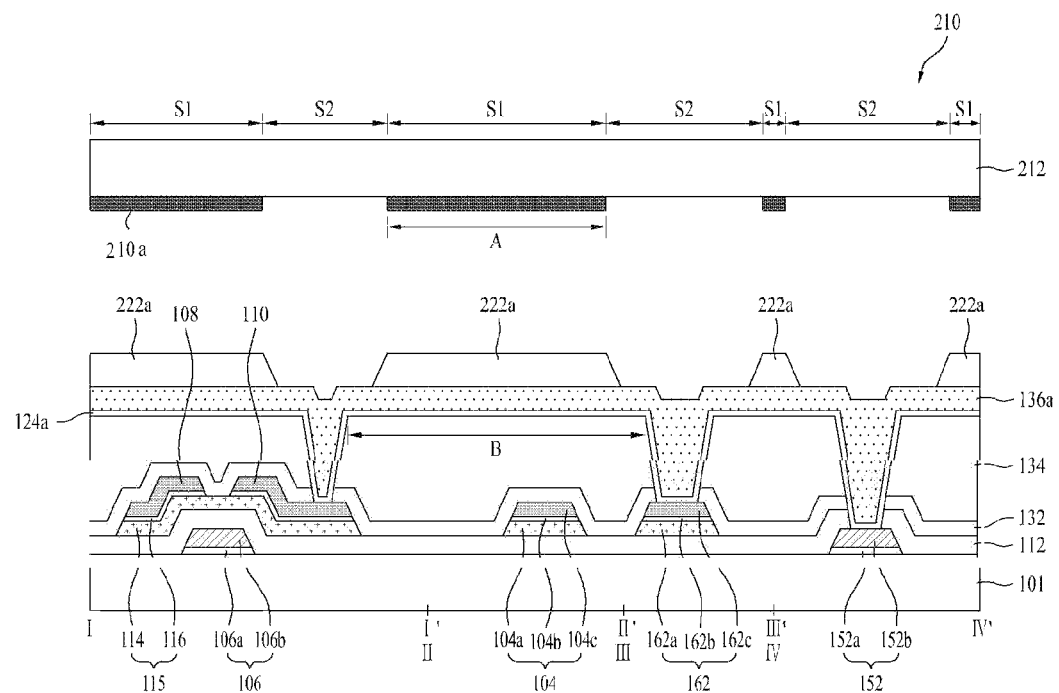

In detail, as shown in the exemplary embodiment shown in FIGS. 8A and 8B, a first transparent electrode layer 124a, a third protective film 136a and photoresist 222 can be stacked on the substrate 101 having the first and second protective films 132 and 134 formed thereon in succession. The first transparent electrode layer 124a can be deposited by sputtering a material including, but not limited to tin oxide (TO), indium tin oxide (ITO), indium zinc oxide (IZO), indium tin zinc oxide (ITZO), or a mixture thereof; and the third protective film 136a can be formed by depositing an inorganic material with PECVD or CVD. And, photoresist is coated on the third protective film 136a and is subjected to photolithography with a fourth mask to expose and develop the photoresist 222. As shown in FIG. 8B, the fourth mask 210 can have a shielding region S1 having a shielding layer 210a formed on the substrate 212 and a transmissive region S2 only of the substrate 212. In this embodiment, the shielding layer 210a at the shielding region S1 of the fourth mask 210 has a width A smaller than a width B of the second protective film 134; and the transmissive region S2 of the fourth mask 210 is positioned at a region in which a third pixel contact hole 120c, a gate contact hole 154d and a data contact hole 164 are to be formed therein for transmitting a UV beam. Since the transmissive region S2 transmits the UV beam, the photoresist is removed therefrom after development. The photoresist pattern 222a having the UV beam incident thereto shielded by the shielding region S1 of the fourth mask 210 has a width A smaller than a width B of the second protective film 134 since the shielding region S1 has a width smaller than the second protective film 134.

Figure 8C:
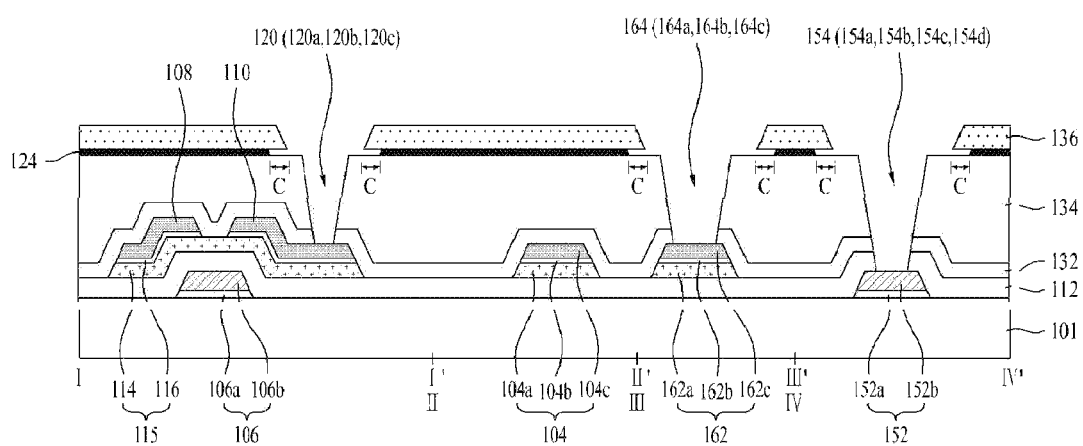

Referring to FIG. 8C, the third protective film 136 is patterned by etching with the photoresist pattern. In this embodiment, since the width A of the photoresist pattern 222a is smaller than the width B of the second protective film 134, the width A of the third protective film 136 is smaller than the width B of the second protective film 134. The width A of the third protective film 136 can be smaller than the width B of the second protective film 134 for improving step coverage at the time of deposition of the pixel electrode 122.

Then, the common electrode 124 can be removed by wet etching with the third protective film 136 used as a mask. In this instance, an undercut is formed at the common electrode 124 by the wet etching, to make the common electrode 124 to have a width smaller than a width C of the third protective film as shown in FIG. 8C. Next, a remained photoresist pattern can be stripped to form the third conductive pattern including the common electrode 124, the common line 126 and the common pad 128, and the third protective film 136 including the gate contact hole 154d, the data contact hole 164c and the third contact hole 120c.

Figure 9A:
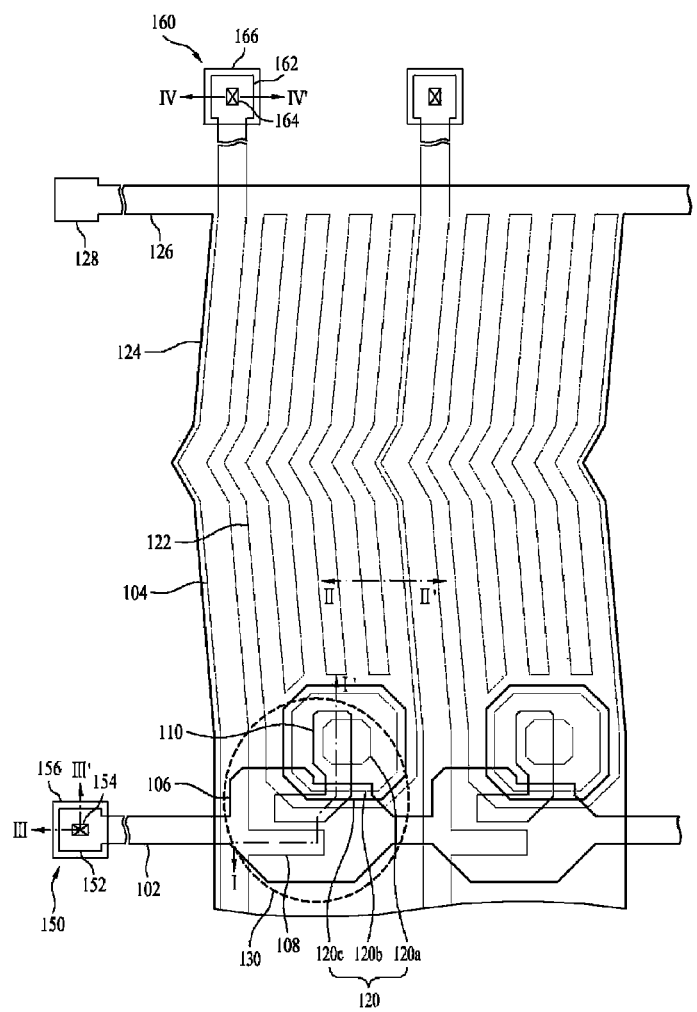
FIGS. 9A and 9B illustrate a plan view and a section showing an exemplary step for fabricating a fourth conductive pattern of the thin film transistor substrate shown in FIG. 1 or 2, respectively.
Figure 9B:
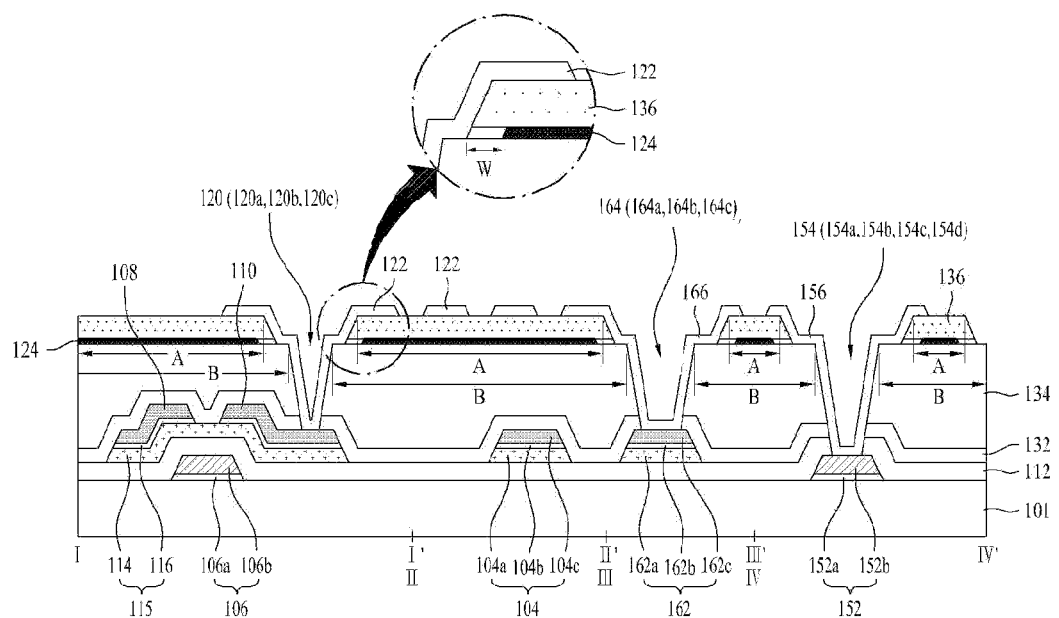

Referring to FIGS. 9A and 9B, a fourth conductive pattern is formed on the substrate 101 having the third protective film 136 and the third conductive pattern formed thereon to include a pixel electrode 122, a gate pad upper electrode 156 and a data pad upper electrode 166.

In detail, a second transparent electrode layer 122a can be formed on the substrate 101 having the third protective film 136, the third conductive pattern formed thereon by deposition, for example, by sputtering. The undercut between the third protective film 136 and the common electrode 124 spaces the second transparent electrode layer 122a from the common electrode 124 as much as a gap W formed by the undercut. In this instance, the second transparent electrode layer 122a is deposited thicker than the first transparent electrode layer formed on the common electrode 124. When the pixel electrode 122 is deposited on the third protective film 135 of the undercut structure, the thickness of the pixel electrode 124 is formed thicker than the thickness of the common electrode, to prevent opening of the pixel electrode 122.

Figure 10:
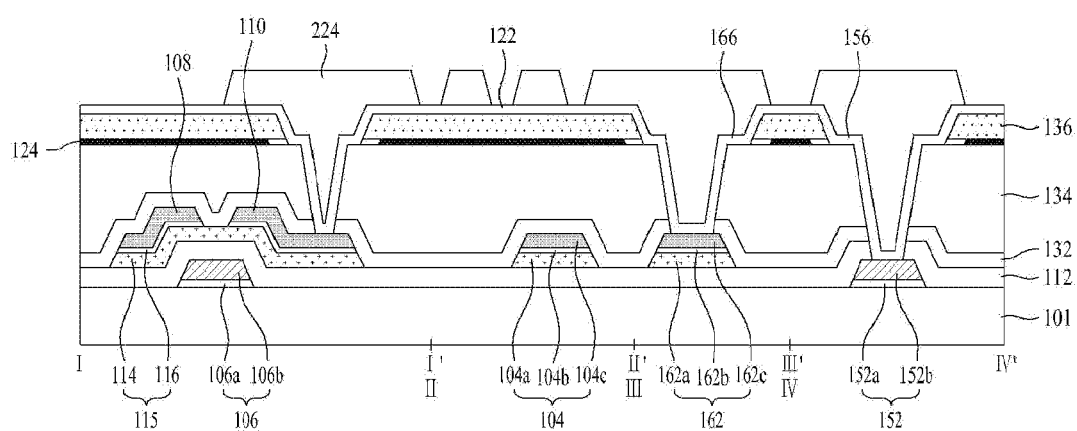
FIG. 10 illustrates a section showing an exemplary mask step for fabricating a fourth conductive pattern in FIG. 9B.

Then, referring to FIG. 10, the second transparent electrode layer 122a can be patterned by photolithography and etching with a fifth mask, to form a fourth conductive pattern including the pixel electrode 122, the gate pattern upper electrode 156 and the data pad upper electrode 166.

As described above, the thin film transistor substrate and the method for fabricating the same according to the present invention have at least one of the following advantages.

The formation of the source/drain electrodes and the semiconductor pattern in the same mask step and the formation of the third protective film and the common electrode in the same mask step, enabling to reduce duplicative mask steps, permit to reduce a number of fabrication steps and allow reducing a fabrication cost and a fabrication time.

The thin film transistor substrate may be formed only by five mask steps without any additional steps.

And, the protective film of organic insulating material permits to reduce the parasitic capacitor between the data lines and the common electrode, enabling to reduce power consumption caused thereby.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A thin film transistor substrate comprising:
    a gate line;
    a data line crossing the gate line;
    a thin film transistor comprising
        (i) a gate electrode connected to the gate lines,
        (ii) a source electrode connected to the data lines,
        (iii) a drain electrode formed to face the source electrode, and
        (iv) a semiconductor pattern formed to overlap with the gate electrode with the gate insulating film disposed therebetween;
    first and second protective films covering the thin film transistor, wherein each of the protective films has pixel contact holes which expose the drain electrode of the thin film transistor;
    a pixel electrode on the second protective film to be connected to the drain electrode; and
    a common electrode forming a fringe field with the pixel electrode, wherein the common electrode is spaced from the pixel electrode by a space provided by an undercut with respect to the second protective film.

2. The thin film transistor substrate as claimed in claim 1, further comprising a gate pad connected to the gate line and a data pad connected to the data line.

3. The thin film transistor substrate as claimed in claim 2, wherein the gate pad comprises;
    a gate pad lower electrode connected to the gate line,
    a gate contact hole passed through the first and second protective films and the gate insulating film, and
    a gate pad upper electrode connected to the gate lower electrode, and formed of the same material on the same layer as the pixel electrode and spaced from the common electrode by the space provided by the undercut.

4. The thin film transistor substrate as claimed in claim 2, wherein the data pad comprises;
    a data pad lower electrode connected to the data line,
    a data contact hole passed through the first and second protective films, and
    a data pad upper electrode connected to the data lower electrode, and formed of the same material, and on the same layer, with the pixel electrode and spaced from the common electrode by the space provided by the undercut.

5. The thin film transistor substrate as claimed in claim 1, wherein the pixel electrode has a thickness thicker than a thickness of the common electrode.

6. The thin film transistor substrate as claimed in claim 1, wherein the second protective film has a width smaller than a width of the first protective film.

7. The thin film transistor substrate as claimed in claim 1, wherein the first protective film comprises two or more protective films.

* * * * *